(12) United States Patent
Thei et al.

(10) Patent No.: US 7,030,728 B2
(45) Date of Patent: Apr. 18, 2006

(54) LAYOUT AND METHOD TO IMPROVE MIXED-MODE RESISTOR PERFORMANCE

(75) Inventors: Kong-Beng Thei, Hsin-Chu (TW); Chih-Hsien Lin, Hsin-Chu (TW); Shyh-Chyi Wong, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/831,848

(22) Filed: Apr. 26, 2004

(65) Prior Publication Data

US 2004/0196138 A1    Oct. 7, 2004

Related U.S. Application Data

(62) Division of application No. 10/037,811, filed on Jan. 4, 2002, now Pat. No. 6,732,422.

(51) Int. Cl.
*H01C 1/012* (2006.01)

(52) U.S. Cl. ........................................ 338/320; 338/204

(58) Field of Classification Search ................ 338/309, 338/307, 42, 308, 204, 325; 257/904, 531, 257/542, 543, 419; 73/204.26, 204.25
See application file for complete search history.

(56) References Cited

U.S. PATENT DOCUMENTS

| | | | | | |
|---|---|---|---|---|---|
| 3,680,013 | A | * | 7/1972 | Pye | 333/81 R |
| 3,714,709 | A | * | 2/1973 | Liederbach | 29/841 |
| 3,716,759 | A | * | 2/1973 | Scace et al. | 361/704 |
| 3,772,628 | A | * | 11/1973 | Underwood et al. | 338/4 |
| 3,902,926 | A | * | 9/1975 | Perloff et al. | 438/383 |
| 4,150,366 | A | * | 4/1979 | Price | 341/121 |
| 4,215,333 | A | * | 7/1980 | Huang | 338/322 |
| 4,317,126 | A | * | 2/1982 | Gragg, Jr. | 257/419 |
| 4,320,655 | A | * | 3/1982 | Kammermaier et al. | 73/204.26 |
| 4,321,616 | A | * | 3/1982 | Bise | 257/536 |
| 4,505,032 | A | * | 3/1985 | Praria | 29/621 |
| 4,584,553 | A | * | 4/1986 | Tokura et al. | 338/320 |
| 4,726,232 | A | * | 2/1988 | Koneval | 73/708 |
| 4,853,669 | A | * | 8/1989 | Guckel et al. | 338/4 |

(Continued)

FOREIGN PATENT DOCUMENTS

JP    58-135661    *    8/1983    ................ 257/536

(Continued)

*Primary Examiner*—Tu Hoang
(74) *Attorney, Agent, or Firm*—Thomas, Kayden, Horstemeyer & Risley

(57) ABSTRACT

A resistor layout and method of forming the resistor are described which achieves improved resistor characteristics, such as resistor stability and voltage coefficient of resistance. A resistor is formed from a conducting material such as doped silicon or polysilicon. The resistor has a rectangular first resistor element, a second resistor element, a third resistor element, a fourth resistor element, and a fifth resistor element. A layer of protective dielectric is then formed over the first, second, and third resistor elements leaving the fourth and fifth resistor elements exposed. The conducting material in the exposed fourth and fifth resistor elements is then changed to a silicide, such as titanium silicide or cobalt silicide, using a silicidation process. The higher conductivity silicide forms low resistance contacts between the second and fourth resistor elements and between the third and fifth resistor elements. The second and third resistor elements are wider than the first resistor element and provide a low resistance contacts to the first resistor element, which is the main resistor element. This provides low voltage coefficient of resistance thermal process stability for the resistor.

13 Claims, 8 Drawing Sheets

U.S. PATENT DOCUMENTS

| | | | |
|---|---|---|---|
| 5,006,421 A * | 4/1991 | Yang et al. ................. 428/641 |
| 5,015,989 A * | 5/1991 | Wohlfarth et al. .......... 338/195 |
| 5,170,237 A * | 12/1992 | Tsuda et al. ................. 257/419 |
| 5,200,733 A * | 4/1993 | Davis et al. ................. 338/64 |
| 5,257,005 A * | 10/1993 | Desroches et al. .......... 338/325 |
| 5,316,978 A * | 5/1994 | Boyd et al. ................. 438/382 |
| 5,412,993 A * | 5/1995 | Ohtani ........................ 73/727 |
| 5,466,484 A * | 11/1995 | Spraggins et al. .......... 438/385 |
| 5,471,056 A * | 11/1995 | Prelat ......................... 250/253 |
| 5,530,418 A * | 6/1996 | Hsu et al. ................... 338/307 |
| 5,567,977 A * | 10/1996 | Jimenez ...................... 257/538 |
| 5,812,047 A * | 9/1998 | van Kampen ................ 338/4 |
| 5,856,702 A * | 1/1999 | Hashimoto ................. 257/538 |
| 5,939,753 A * | 8/1999 | Ma et al. ..................... 257/339 |
| 6,140,910 A * | 10/2000 | Smith et al. ................. 338/309 |
| 6,144,287 A * | 11/2000 | Komeda ..................... 338/195 |
| 6,150,917 A * | 11/2000 | Meyer et al. ................. 338/4 |
| 6,184,774 B1* | 2/2001 | Takeuchi ..................... 338/42 |
| 6,557,411 B1* | 5/2003 | Yamada et al. ........... 73/204.26 |
| 6,856,233 B1* | 2/2005 | Tsukada et al. ............. 338/195 |
| 2002/0060352 A1* | 5/2002 | Mizuno ...................... 257/537 |
| 2004/0196139 A1* | 10/2004 | Nakamura et al. .......... 338/328 |

FOREIGN PATENT DOCUMENTS

| JP | 58-143562 | * | 8/1983 | ................. 257/536 |
| JP | 64-17490 | * | 1/1989 | |
| JP | 7-30065 | * | 1/1995 | |

* cited by examiner

LAYOUT AND METHOD TO IMPROVE MIXED-MODE RESISTOR PERFORMANCE

CROSS-REFERENCE TO RELATED APPLICATIONS

This is a division of patent application Ser. No. 10/037,811, filing date Jan. 4, 2002, now U.S. Pat. No. 6,732,422, A New Layout And Method To Improve Mixed-Mode Resistor Performance, assigned to the same assignee of the present invention, which is hereby incorporated by reference in its entirety.

BACKGROUND OF THE INVENTION

1. Field of the Invention

This invention relates to a layout and method to improve linearity and reduce voltage coefficient of resistance for resistors used in mixed-mode analog/digital applications.

2. Description of the Related Art

U.S. Pat. No. 6,103,622 to Huang describes a silicide process for mixed-mode analog digital/devices.

U.S. Pat. No. 5,924,011 to Huang describes a method for fabricating mixed analog/digital devices using a silicide process.

U.S. Pat. No. 6,054,359 to Tsui et al. describes a method for fabricating high sheet resistance polysilicon resistors.

U.S. Pat. No. 5,885,862 to Jao et al. describes a poly-load resistor for a static random access memory, SRAM, cell.

A paper entitled "Characterization of Polysilicon Resistors in Sub-0.25 µm CMOS USLI Applications" by Wen-Chau Liu, Member IEEE, Kong-Beng Thei, Hung-Ming Chuang, Kun-Wei Lin, Chin-Chuan Cheng, Yen-Shih Ho, Chi-Wen Su, Shyh-Chyi Wong, Chih-Hsien Lin, and Carlos H. Diaz, IEEE Electron Device Letters, Vol. 22, No. 7, pages 318–320, July 2001 describes characterization of polysilicon resistors.

SUMMARY OF THE INVENTION

High performance resistors are important devices in the design of mixed-mode analog/digital circuits. A number of parameters are of key importance for these resistors such as resistor linearity, insensitivity of resistance to thermal processing steps, and voltage coefficient of resistance (VCR).

It is a principal objective of at least one embodiment of this invention to provide a method of forming a resistor having good linearity, thermal process stability, and low voltage coefficient of resistance (VCR).

It is another principal objective of at least one embodiment of this invention to provide a resistor layout for a resistor having good linearity, thermal process stability, and low voltage coefficient of resistance (VCR).

These objectives are achieved by first forming a resistor from a first conducting material such as doped polysilicon. The resistor has a rectangular first resistor element having a width, a length, a first end, and a second end; a second resistor element having a first edge and a second edge wherein the first edge of the second resistor element contacts the entire width of the first end of the first resistor element; a third resistor element having a first edge and a second edge wherein the first edge of the third resistor element contacts the entire width of the second end of the first resistor element; a fourth resistor element having a contact edge wherein the contact edge of the fourth resistor element contacts the entire the second edge of the second resistor element; and a fifth resistor element having a contact edge wherein the contact edge of the fifth resistor element contacts the entire the second edge of the third resistor element. A layer of protective dielectric is then formed over the first, second, and third resistor elements leaving the fourth and fifth resistor elements exposed.

The first conducting material in the exposed fourth and fifth resistor elements is then changed to a second conducting material, which is a silicide, using a silicidation process. The second conducting material is a silicide such as titanium silicide. The second conducting material has a higher conductivity than the first conducting material. The higher conductivity second conducting material forms low resistance contacts between the second and fourth resistor elements and between the third and fifth resistor elements. The second and third resistor elements are wider than the first resistor element and provide a low resistance contacts to the first resistor element, which is the main resistor element. This provides low voltage coefficient of resistance and good resistor linearity.

The protective dielectric over the first, second, and third resistor elements prevents the resistor from silicidation during subsequent process steps.

DESCRIPTION OF THE PREFERRED EMBODIMENTS

Figure 1:
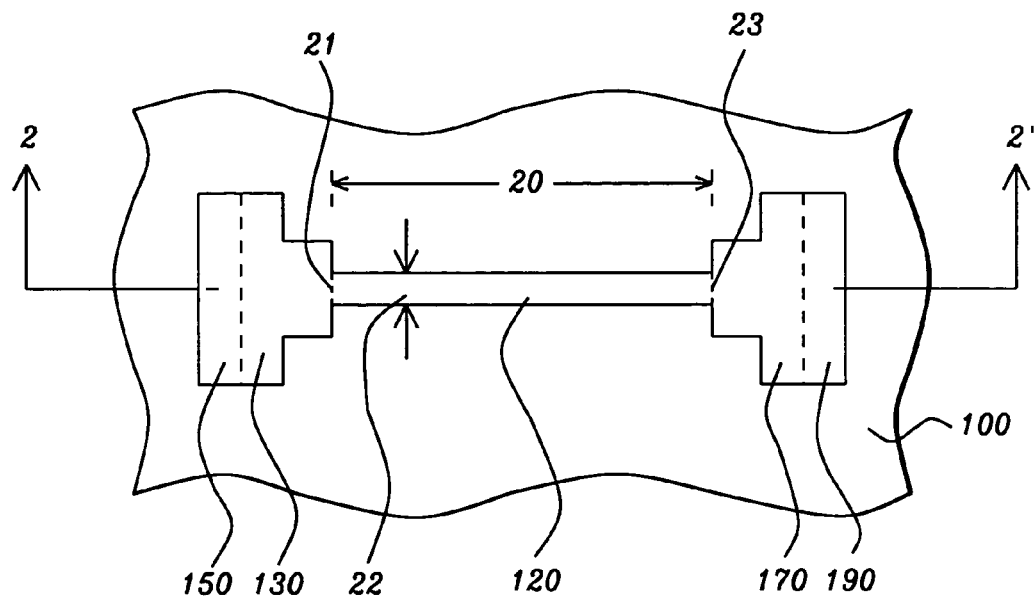
FIG. 1 shows a top view of one embodiment of the resistor of this invention before the protective dielectric layer has been formed.
Figure 2:
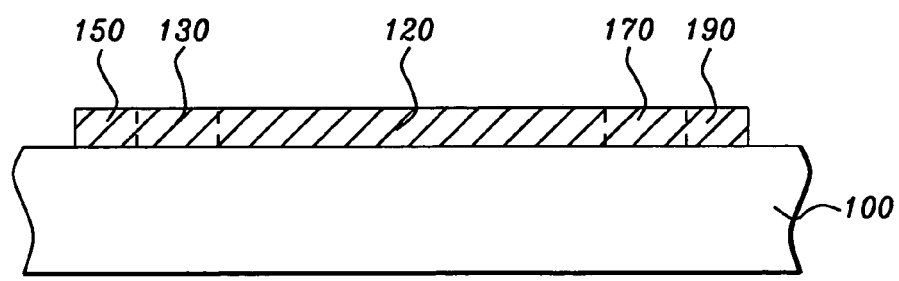
FIG. 2 shows a cross section view of the resistor of FIG. 1 taken along line 2–2' of FIG. 1.

Refer now to the drawings for a detailed description of the preferred embodiments of this invention. FIG. 1 shows a top view of a resistor having a first resistor element 120, a second resistor element 130, a third resistor element 170, a fourth resistor element 150, and a fifth resistor element 190. The resistor is formed on a substrate 100, such as a silicon substrate having devices formed therein. FIG. 2 shows a cross section of the resistor at this stage of fabrication taken along line 2–2' of FIG. 1. The boundaries between the first 120 and second 130 resistor elements, the first 120 and third 170 resistor elements, the second 130 and fourth 150 resistor elements, and the third 170 and fifth 190 resistor elements are shown by dashed lines in FIGS. 1 and 2. The resistor is formed of a patterned layer of conducting material. The conducting material can be doped polysilicon doped with either N type impurities or P type impurities. As shown in FIG. 1, the first resistor element 120 is a rectangle having a length 20, a width 22, a first end 21, and a second end 23. The polysilicon is deposited, patterned, and doped using techniques well known to those skilled in the art.

The resistance of the resistor is primarily determined by the resistance of the first resistor element 120, as will be described in greater detail later. The resistance of the first resistor element is determined by the doping of the polysilicon, which determines the conductivity of the polysilicon, the length 20 of the first resistor element 120, and width 22 of the first resistor element 120.

Figure 3:
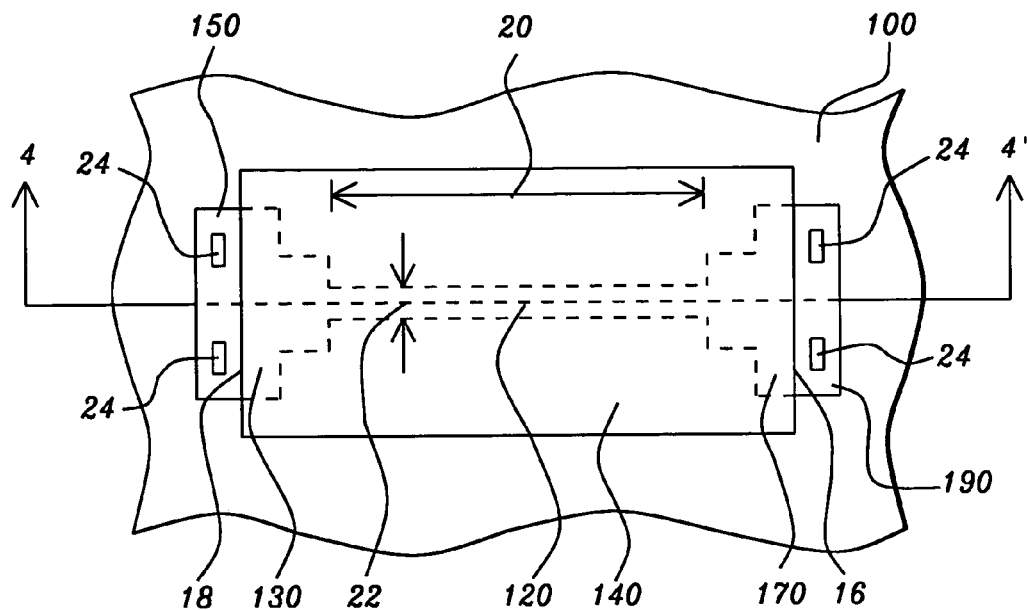
FIG. 3 shows a top view of the embodiment of the resistor of this invention shown in FIG. 1 after the protective dielectric layer has been formed.
Figure 4:
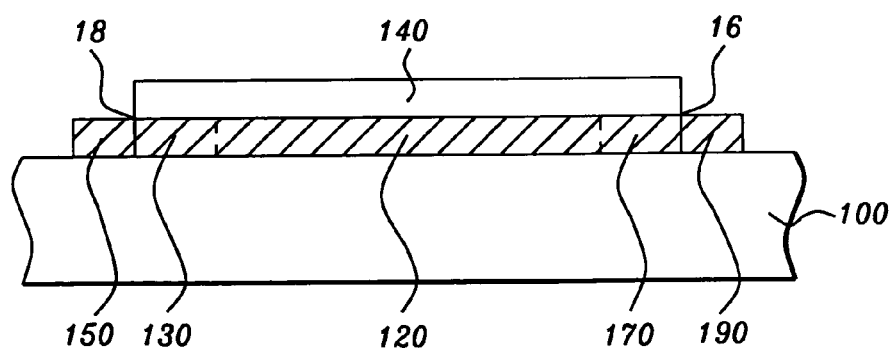
FIG. 4 shows a cross section view of the resistor of FIG. 3 taken along line 4–4' of FIG. 3.

As shown in FIGS. 3 and 4, a layer of protective dielectric 140 is deposited and patterned to cover the first 120, second 130, and third 170 resistor elements. The fourth 150 and fifth 190 resistor elements are not covered by the protective dielectric 140. The protective dielectric can be an oxide, such as silicon oxide, or silicon nitride deposited and patterned using techniques well known to those skilled in the art.

Next a silicidation process, well known to those skilled in the art, is carried out which converts the conducting material in the fourth 150 and fifth 190 resistor elements to a silicide. In this example the conducting material of polysilicon in the fourth 150 and fifth 190 resistor elements is converted to a silicide such as titanium silicide, cobalt silicide, or the like. As those skilled in the art will readily recognize the silicidation process is usually part of the process for forming contacts in other regions of the substrate 100. The protective dielectric 140 protects the first 120, second 130, and third 170 resistor elements from the silicidation process so that the first conducting material remains unchanged and the conductivity of the conducting material forming the first 120, second 130, and third 170 resistor elements remains unchanged. The protective dielectric 140 also protects the conducting material forming the first 120, second 130, and third 170 resistor elements from subsequent process steps so that the conductivity of the conducting material in these regions is not changed. Contacts 24 to the resistor can be formed in the fourth 150 and fifth 190 resistor elements using methods well known to those skilled in the art.

The conductivity of the silicide in the fourth 150 and fifth 190 resistor elements is substantially greater than the conductivity of the conducting material in the first 120, second 130, and third 170 resistor elements. The resistance of the interface 18 between the second resistor element 130 and the interface 16 between the third 170 and fifth 190 resistor elements is low compared to the resistance of the first resistor element 120 because the conducting material forming the fourth 150 and fifth 190 resistor elements has been converted to a silicide. The second 130 and third 170 resistor elements are designed to be wide relative to the width 22 of the first 120 resistor element so their resistance will be small compared to the first 120 resistor element.

The resistance, R, of the resistor can be expressed as $R = R_1 + 2R_2 + 2R_3 + 2R_4 + R_5$. In this equation $R_1$ is the resistance of the first 120 resistor element, $R_2$ is the resistance of the contacts 24 to the fourth 150 and fifth 190 resistor elements, $R_3$ is the resistance of the fourth 150 and fifth 190 resistor elements, $R_4$ is the resistance of interfaces, 18 and 16, between the second 130 and fourth 150 resistor elements and between the third 170 and fifth 190 resistor elements, and $R_5$ is the resistance of the second 130 and third 170 resistor elements. Of these resistances $R_2$, $R_3$, $R_4$, and $R_5$ are all quite small with respect to $R_1$, and the resistance, R, of the resistor is very nearly equal to $R_1$. This makes it possible to accurately adjust the resistance of the resistor by controlling the doping of the polysilicon, the length 20 of the first resistor element 120, and the width 22 of the first resistor element 120.

Figure 5:
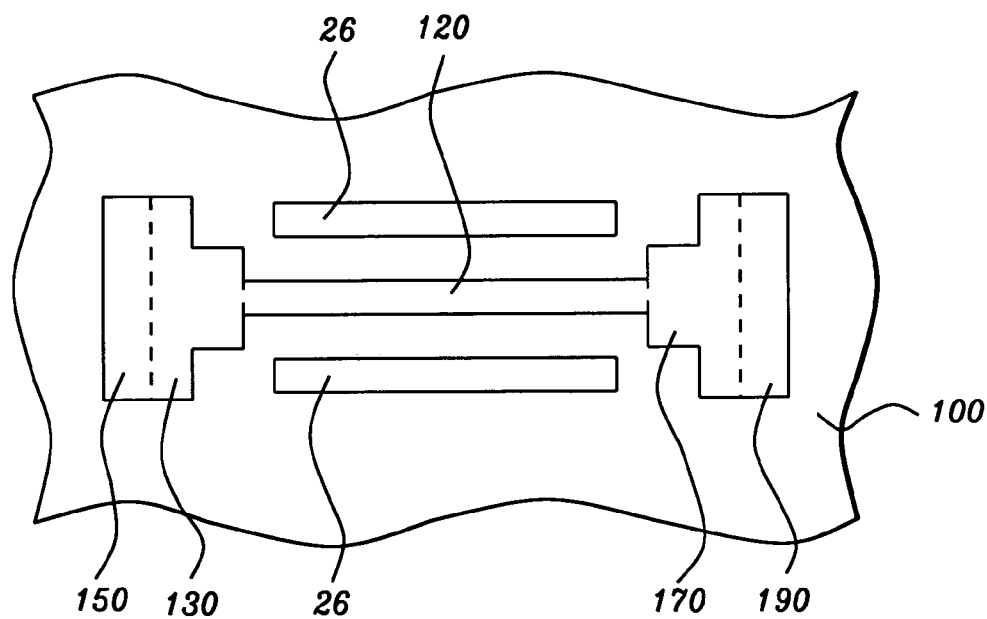
FIG. 5 shows a top view of another embodiment of the resistor of this invention before the protective dielectric layer has been formed.
Figure 6:
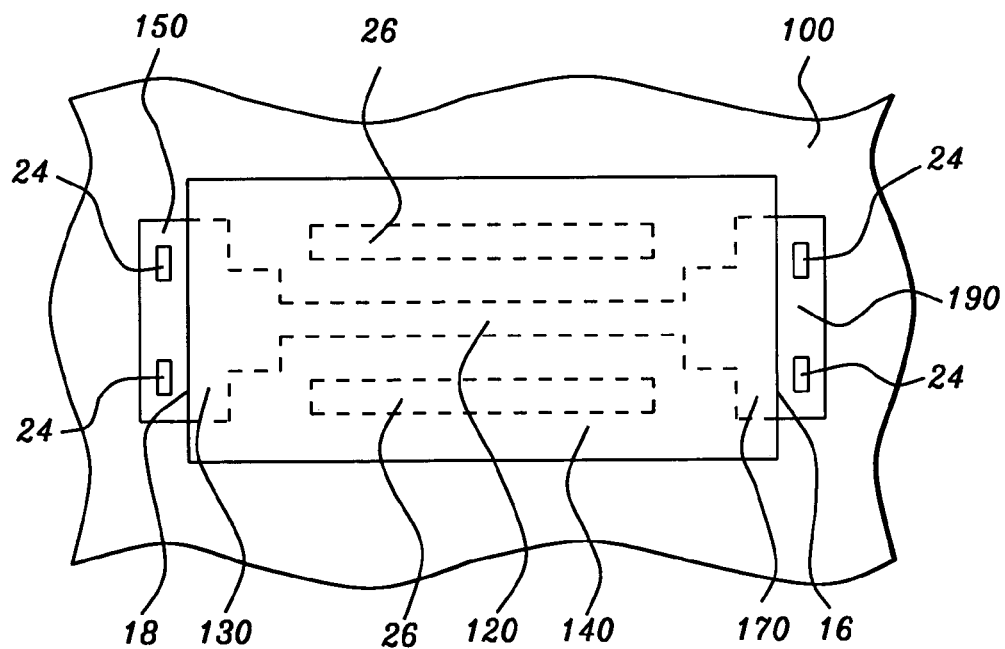
FIG. 6 shows a top view of the embodiment of the resistor of this invention shown in FIG. 5 after the protective dielectric layer has been formed.

Another embodiment of the resistor layout of this invention is shown in FIGS. 5 and 6. As shown in FIGS. 5 and 6 dummy resistor elements 26 can be formed on either side of the first resistor element 120. The dummy resistor elements 26 can be used to compensate for proximity effects when the dimensions of the first resistor element 120 are very small. FIG. 5 shows the resistor before the protective dielectric layer 140 is formed. FIG. 6 shows the resistor after the protective dielectric layer 140 is formed.

Figure 7:
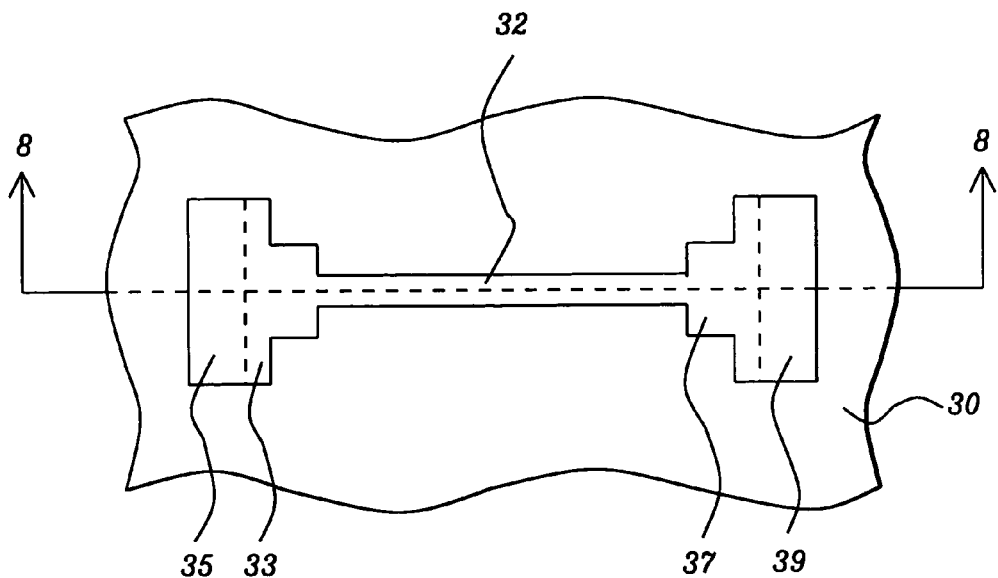
FIG. 7 shows a top view of another embodiment of the resistor of this invention before the protective dielectric layer has been formed.
Figure 8:
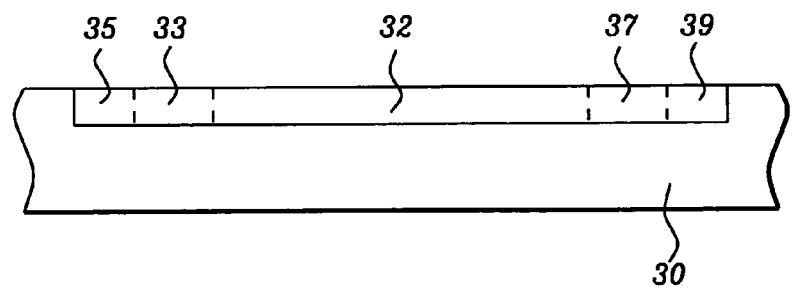
FIG. 8 shows a cross section view of the resistor of FIG. 7 taken along line 8–8' of FIG. 7.

FIGS. 7–11 show another embodiment of the resistor layout and method of this invention. FIG. 7 shows the top view of a resistor and FIG. 8 a cross section taken along line 8–8' of FIG. 7. As in the preceding embodiments, the resistor has a first resistor element 32, a second resistor element 33, a third resistor element 37, a fourth resistor element 35, and a fifth resistor element 39. In this embodiment, as can be seen in FIG. 8, the resistor is formed within the substrate 30 and at the top surface of the substrate. In this embodiment the first 32, second 33, third 37, fourth 35, and fifth 39 resistor elements can be formed by a patterned deposition of impurities in a silicon substrate 30 using techniques well known to those skilled in the art. In this embodiment the first 32, second 33, third 37, fourth 35, and fifth 39 resistor elements can be formed by deposition of N or P type impurities in a silicon substrate 30.

Figure 9:
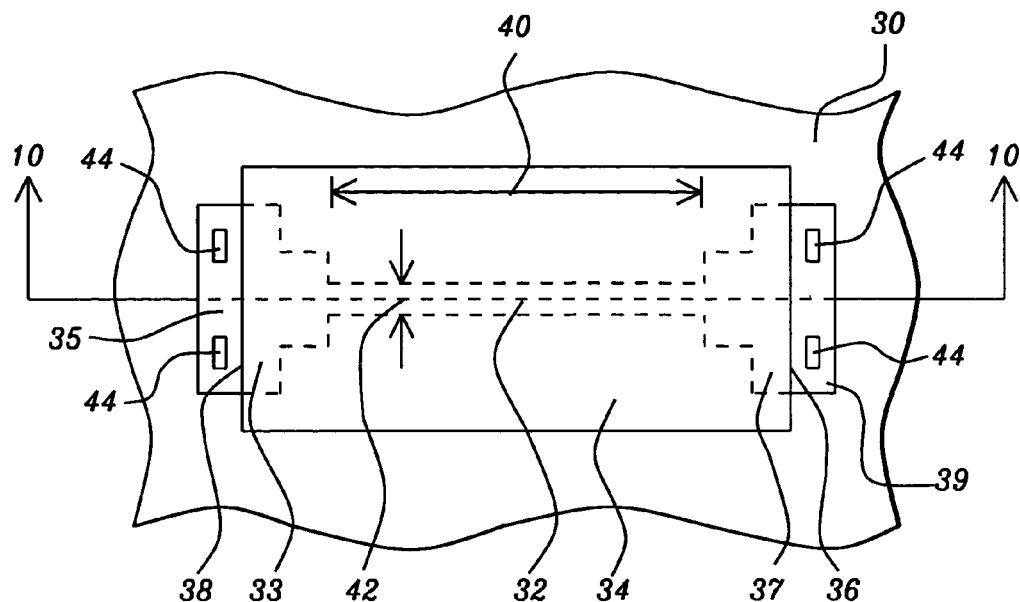
FIG. 9 shows a top view of the embodiment of the resistor of this invention shown in FIG. 8 after the protective dielectric layer has been formed.
Figure 10:
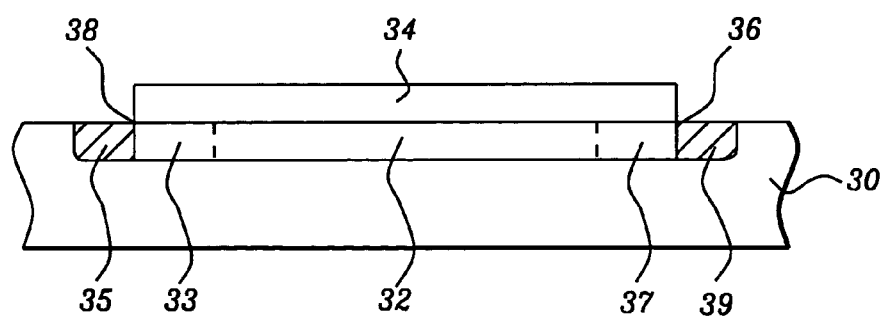
FIG. 10 shows a cross section view of the resistor of FIG. 9 taken along line 10–10' of FIG. 9.

As shown in FIGS. 9 and 10, a layer of protective dielectric 34 is deposited and patterned to cover the first 32, second 33, and third 37 resistor elements. The fourth 35 and fifth 39 resistor elements are not covered by the protective dielectric 34. The protective dielectric can be an oxide such as silicon oxide deposited and patterned using techniques well known to those skilled in the art.

Next a silicidation process, well known to those skilled in the art, is carried out which converts the conducting material in the fourth 35 and fifth 39 resistor elements to a silicide. In this example with the conducting material of silicon the conducting material in the fourth 35 and fifth 39 resistor elements can be converted to a silicide such as titanium silicide, cobalt silicide, or the like. As those skilled in the art will readily recognize the silicidation process is usually part of the process for forming contacts in other regions of the substrate 30. The protective dielectric 34 protects the first 32, second 33, and third 37 resistor elements from the silicidation process so that the first conducting material remains unchanged and the conductivity of the conducting material forming the first 32, second 33, and third 37 resistor elements remains unchanged. The protective dielectric 34 also protects the conducting material forming the first 32, second 33, and third 37 resistor elements from subsequent process steps so that the conductivity of the conducting material in these regions is not changed. Contacts 34 to the resistor can be formed in the fourth 35 and fifth 39 resistor elements using methods well known to those skilled in the art.

The conductivity of the silicide in the fourth 35 and fifth 39 resistor elements is substantially greater than the conductivity of the conducting material in the first 32, second 33, and third 37 resistor elements. The resistance of the interface 38 between the second resistor element 33 and the interface 36 between the third 37 and fifth 39 resistor elements is low compared to the resistance of the first resistor element 32 because the conducting material forming the fourth 35 and fifth 39 resistor elements has been converted to a silicide. The second 33 and third 37 resistor elements are designed to be wide relative to the width 42 of the first 32 resistor element so their resistance will be small compared to the first 32 resistor element.

The resistance, R, of the resistor can be expressed as $R=R_1+2R_2+2R_3+2R_4+R_5$. In this equation $R_1$ is the resistance of the first 32 resistor element, $R_2$ is the resistance of the contacts 44 to the fourth 35 and fifth 39 resistor elements, $R_3$ is the resistance of the fourth 35 and fifth 39 resistor elements, $R_4$ is the resistance of interfaces, 38 and 36, between the second 33 and fourth 35 resistor elements and between the third 37 and fifth 39 resistor elements, and $R_5$ is the resistance of the second 33 and third 37 resistor elements. Of these resistances $R_2$, $R_3$, $R_4$, and $R_5$ are all quite small with respect to $R_1$, and the resistance, R, of the resistor is very nearly equal to $R_1$. This makes it possible to accurately adjust the resistance of the resistor by controlling the doping of the silicon, the length 40 of the first resistor element 32, and the width 42 of the first resistor element. In addition to providing the ability to accurately design the resistance of the resistor, the protective dielectric keeps the resistance stable throughout subsequent processing. The design and methods of this invention provides a resistor having a low voltage coefficient of resistance (VCR).

Figure 11:
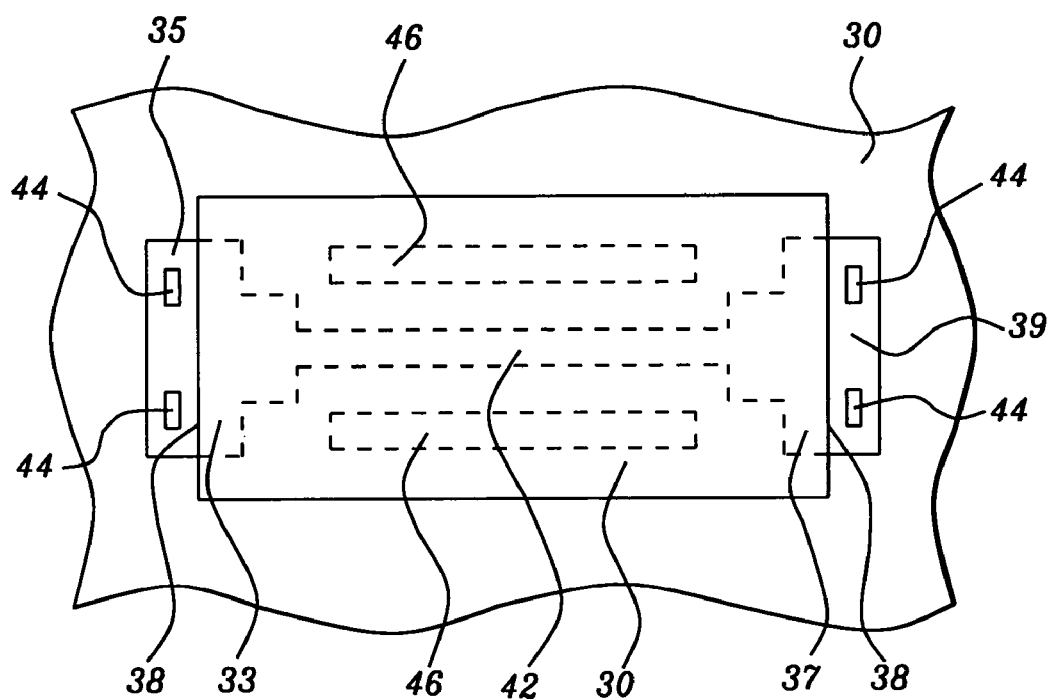
FIG. 11 shows a top view of another embodiment of the resistor of this invention after the protective dielectric layer has been formed.

Another embodiment of the resistor layout of this invention is shown in FIG. 11. As shown in FIG. 11 dummy resistor elements 46 can be formed on either side of the first resistor element 32. The dummy resistor elements 46 can be used to compensate for proximity effects when the dimensions of the first resistor element 32 are very small. FIG. 6 shows the resistor with dummy resistor elements 46 after the protective dielectric layer 34 has been formed.

Figure 12:
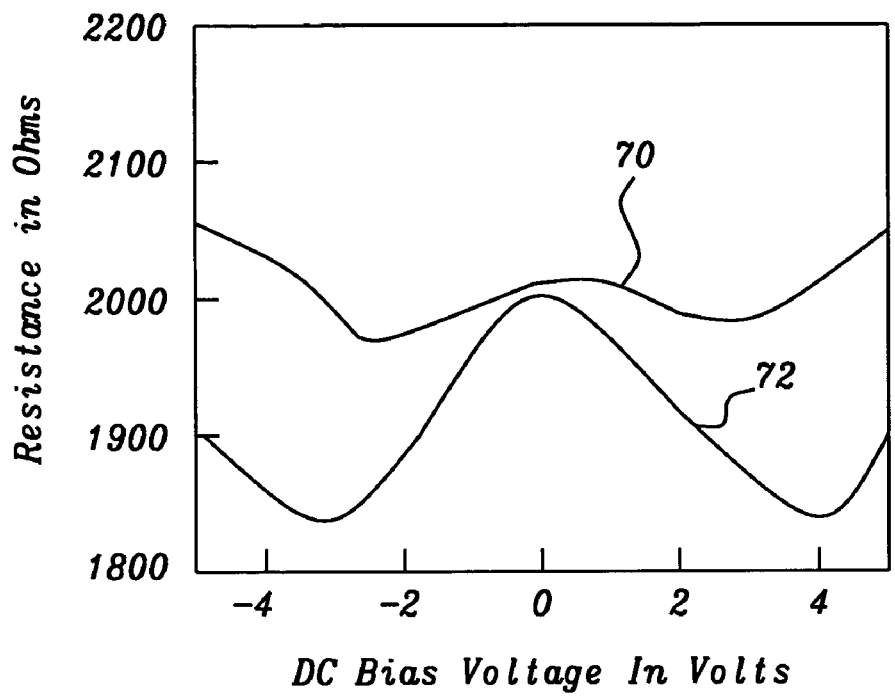
FIG. 12 shows resistance as a function of voltage for a $P^+$ doped polysilicon resistor having the protective dielectric layer of this invention and a $P^+$ doped polysilicon resistor, having the same doping level, without the protective dielectric layer.

The improvement of resistor characteristics due to the protective dielectric layer of this invention is shown in FIGS. 12–15. FIG. 12 shows a first curve 70 and a second curve 72. The first curve 70 shows resistance as a function of voltage for a P+ doped polysilicon resistor having the protective dielectric layer of this invention. The second curve 72 shows resistance as a function of voltage for a P+ doped polysilicon resistor having the same doping level but without the protective dielectric layer.

Figure 13:
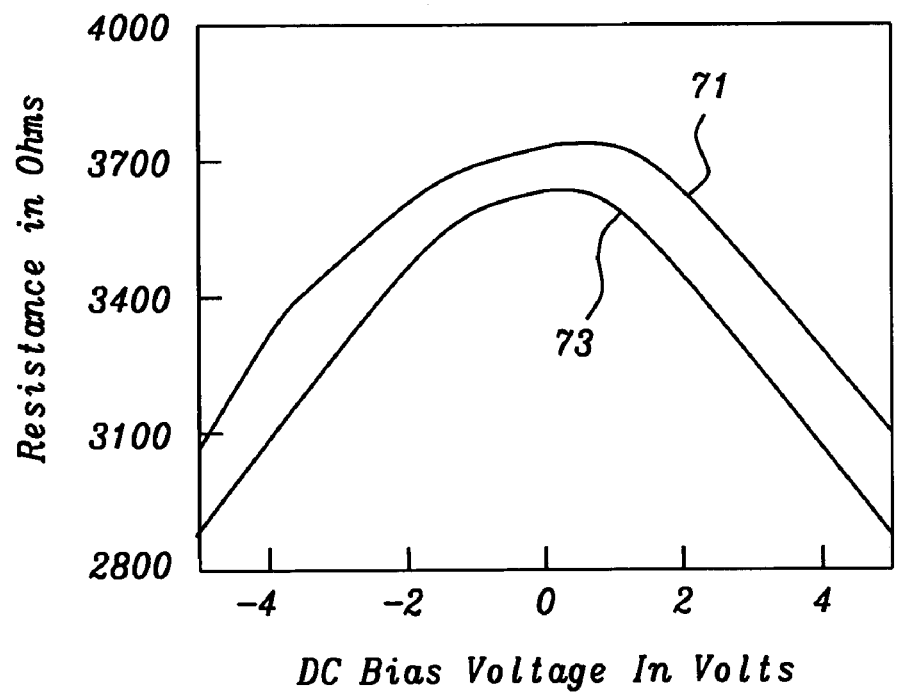
FIG. 13 shows resistance as a function of voltage for an $N^+$ doped polysilicon resistor having the protective dielectric layer of this invention and an $N^+$ doped polysilicon resistor, having the same doping level, without the protective dielectric layer.

FIG. 13 shows a third curve 71 and a fourth curve 73. The third curve 71 shows resistance as a function of voltage for an $N^+$ doped polysilicon resistor having the protective dielectric layer of this invention. The fourth curve 73 shows resistance as a function of voltage for an $N^+$ doped polysilicon resistor having the same doping level but without the protective dielectric layer.

Figure 14:
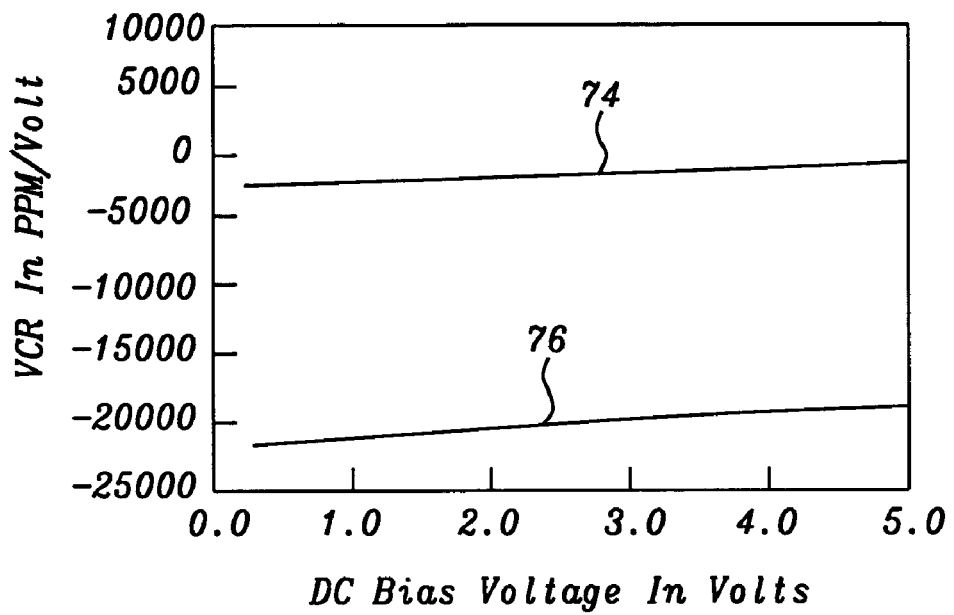
FIG. 14 shows the voltage coefficient of resistance as a function of voltage for a $P^+$ doped polysilicon resistor having the protective dielectric layer of this invention and a P+ doped polysilicon resistor, having the same doping level, without the protective dielectric layer.

FIG. 14 shows a fifth curve 74 and a sixth curve 76. The fifth curve 74 shows the voltage coefficient of resistance as a function of voltage for a $P^+$ doped polysilicon resistor having the protective dielectric layer of this invention. The sixth curve 76 shows the voltage coefficient of resistance as a function of voltage for a $P^+$ doped polysilicon resistor having the same doping level but without the protective dielectric layer.

Figure 15:
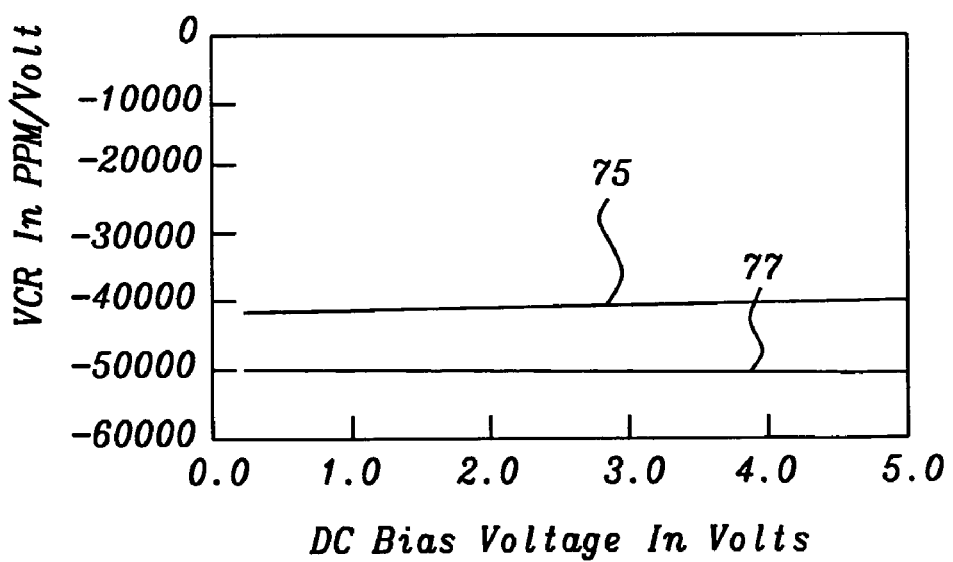
FIG. 15 shows the voltage coefficient of resistance as a function of voltage for an N+ doped polysilicon resistor having the protective dielectric layer of this invention and an N+ doped polysilicon resistor, having the same doping level, without the protective dielectric layer.

FIG. 15 shows a seventh curve 75 and a eighth curve 77. The seventh curve 75 shows the voltage coefficient of resistance as a function of voltage for an $N^+$ doped polysilicon resistor having the protective dielectric layer of this invention. The eighth curve 77 shows the voltage coefficient of resistance as a function of voltage for an $N^+$ doped polysilicon resistor having the same doping level but without the protective dielectric layer.

While the invention has been particularly shown and described with reference to the preferred embodiments thereof, it will be understood by those skilled in the art that various changes in form and details may be made without departing from the spirit and scope of the invention.

What is claimed is:

1. A resistor, comprising:
   a substrate;
   a rectangular first resistor element having a width, a length, a first end, and a second end formed of a first conducting material on or within said substrate;
   a second resistor element having a first edge and a second edge formed of said first conducting material on said substrate wherein said first edge of said second resistor element is wider than said first end of said first resistor and said first edge of said second resistor element contacts the entire width of said first end of said first resistor element;
   a third resistor element having a first edge and a second edge formed of said first conducting material on said substrate wherein said first edge of said third resistor element contacts the entire width of said second end of said first resistor element;
   a protective dielectric formed over said first, second, and third resistor elements;
   a fourth resistor element having a contact edge formed of a second conducting material, which is different from the first conducting material on said substrate wherein said contact edge of said fourth resistor element contacts the entire said second edge of said second resistor element and said second conducting material has a higher conductivity than said first conducting material;
   a fifth resistor element having a contact edge formed of a second conducting material on said substrate wherein said contact edge of said fifth resistor element contacts the entire said second edge of said third resistor element; and
   dummy resistor elements adjacent to said rectangular first resistor element wherein said dummy resistor elements do not contact said first, second, third, fourth, or fifth resistor elements.

2. The resistor of claim 1 wherein said first conducting material is doped polysilicon.

3. The resistor of claim 1 wherein said first conducting material is polysilicon doped with either N type or P type impurities.

4. The resistor of claim 1 wherein said second conducting material is selected from the group consisting of silicide, titanium silicide, and cobalt silicide.

5. The resistor of claim 1 wherein said protective layer is silicon oxide.

6. The resistor of claim 1 wherein said protective layer is silicon nitride.

7. The resistor of claim 1, wherein the resistor has two dummy resistor elements respectively adjacent to two opposite sides of said rectangular first resistor element.

8. The resistor of claim 7, wherein each of the dummy resistors is rectangular.

9. The resistor of claim 7, wherein each of the dummy resistors has substantially the same distance away from the rectangular first resistor element.

10. A resistor, comprising:
   a substrate;
   a rectangular first resistor element formed of doped silicon having an end on or within said substrate;
   a T-shaped second resistor element formed of doped silicon having a first edge and a second edge wider than the first edge, first edge contacting the end of the first resistor element, wherein the first edge is wider than the end; and
   a rectangular third resistor element with a third edge having a width substantially equal to the second edge, comprising a metallic silicon.

11. The resistor of claim 10, further comprising two dummy resistor elements respectively adjacent to two opposite sides of said rectangular first resistor element, wherein said dummy resistor elements do not contact said first, second, or third resistor elements.

12. The resistor of claim 11, wherein each of the dummy resistors is rectangular.

13. The resistor of claim 11, wherein each of the dummy resistors has substantially the same distance away from the rectangular first resistor element.

* * * * *